United States Patent
Regan et al.

(10) Patent No.: US 9,449,833 B1
(45) Date of Patent: Sep. 20, 2016

(54) METHODS OF FABRICATING SELF-ALIGNED FETS USING MULTIPLE SIDEWALL SPACERS

(71) Applicant: HRL LABORATORIES, LLC., Malibu, CA (US)

(72) Inventors: Dean C. Regan, Simi Valley, CA (US); Keisuke Shinohara, Thousand Oaks, CA (US); Yan Tang, Oak Park, CA (US); Miroslav Micovic, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/101,102

(22) Filed: Dec. 9, 2013

Related U.S. Application Data

(60) Provisional application No. 61/772,753, filed on Mar. 5, 2013.

(51) Int. Cl.
- *H01L 21/285* (2006.01)
- *H01L 29/66* (2006.01)
- *H01L 21/28* (2006.01)

(52) U.S. Cl.
CPC ... *H01L 21/28587* (2013.01); *H01L 21/28114* (2013.01); *H01L 29/66477* (2013.01)

(58) Field of Classification Search
USPC ........................................................ 438/574
See application file for complete search history.

(56) References Cited

U.S. PATENT DOCUMENTS

| | | | |
|---|---|---|---|
| 4,673,960 A * | 6/1987 | Chao et al. | 257/283 |
| 5,298,444 A * | 3/1994 | Ristow | 438/571 |
| 5,538,910 A * | 7/1996 | Oku | 438/172 |
| 5,929,467 A | 7/1999 | Kawai et al. | |
| 6,054,355 A | 4/2000 | Inumiya | |
| 6,483,135 B1 * | 11/2002 | Mizuta et al. | 257/283 |
| 6,515,320 B1 | 2/2003 | Azuma et al. | |
| 7,015,518 B2 | 3/2006 | Kobayashi | |
| 8,237,198 B2 | 8/2012 | Wu | |
| 8,383,471 B1 | 2/2013 | Shinihara et al. | |
| 8,558,281 B1 | 10/2013 | Regan | |
| 8,686,473 B1 | 4/2014 | Micovic | |
| 8,698,201 B1 | 4/2014 | Regan | |
| 8,841,154 B2 * | 9/2014 | Yoon et al. | 438/47 |
| 8,941,118 B1 | 1/2015 | Chu | |
| 8,946,724 B1 | 2/2015 | Shinohara | |
| 2008/0128753 A1 | 6/2008 | Parikh | |

(Continued)

OTHER PUBLICATIONS

From U.S. Appl. No. 12/792,529 (now U.S. Pat. No. 8,686,473), Office Action mailed on Feb. 27, 2014.

(Continued)

*Primary Examiner* — Michael Jung
(74) *Attorney, Agent, or Firm* — Ladas & Parry

(57) ABSTRACT

A self-aligned process for locating a stem of a T-shaped gate relative to source and drain contacts of a FET or HEMT. The gate stem is located asymmetrically in some embodiments and in such embodiments the stem of the T-shaped gate is located relative to drain and source contacts of the device by forming a plurality of sidewall spacers, with more sidewall spacers being formed on the drain side of the stem than are formed on the source side of the stem. Additionally the gate stem preferably has a high aspect ratio to improve the performance of the resulting FET or HEMT. Drain and source contacts are preferably formed of an n+ semiconductor material.

28 Claims, 7 Drawing Sheets

(56) References Cited

U.S. PATENT DOCUMENTS

| | | | |
|---|---|---|---|
| 2008/0169474 | A1 | 7/2008 | Sheppard |
| 2009/0283756 | A1 | 11/2009 | Hellings |
| 2010/0019279 | A1 | 1/2010 | Chen |
| 2010/0117163 | A1* | 5/2010 | Miyashita ............ 257/408 |
| 2010/0140660 | A1 | 6/2010 | Wu |
| 2010/0301395 | A1* | 12/2010 | Xu et al. ............ 257/194 |
| 2011/0284865 | A1 | 11/2011 | Inoue |
| 2012/0156836 | A1* | 6/2012 | Shealy et al. ............ 438/172 |
| 2012/0292665 | A1 | 11/2012 | Marino |
| 2013/0043485 | A1 | 2/2013 | Ueno |
| 2013/0087803 | A1 | 4/2013 | Kizilyalli |
| 2013/0105887 | A1* | 5/2013 | Zuniga et al. ............ 257/330 |
| 2013/0119400 | A1 | 5/2013 | Shinohara et al. |
| 2014/0027864 | A1* | 1/2014 | Zhu et al. ............ 257/410 |
| 2014/0091308 | A1* | 4/2014 | Dasgupta et al. ............ 257/76 |
| 2014/0306235 | A1 | 10/2014 | Decoutere |

OTHER PUBLICATIONS

From U.S. Appl. No. 13/907,704 (unpublished; non publication requested), Office Action mailed on Jun. 6, 2014.

From U.S. Appl. No. 12/792,529, Application and Office Actions including but not limited to Office Actions dated Jun. 21, 2012, Oct. 15, 2012, Jun. 14, 2013, Aug. 27, 2013, and Oct. 10, 2013.

C. H. Chen, S. Keller, G. Parish, R. Vetury, P. Kozokoy, E. L. Hu, S. P. DenBaars, and U. K. Mishra, "High-transconductance self-aligned AlGaN/GaN modulation-doped field-effect transistors with regrown ohmic contacts", Appl. Phys. Lett., vol. 73 (1998), pp. 3147-3149.

H. Kawai, M. Hara, F. Nakamura, and S. Imanaga, "AlN/GaN insulated gate heterostructure FET with regrown n+ GaN ohmic contact", Electronics Lett., vol. 34, (1998), pp. 592-593.

S. Heikman, S. Keller, S. P. DenBaars, and U. K. Mishra, "Mass transport regrowth of GaN for ohmic contacts to AlGaN/GaN", Appl. Phys. Lett. vol. 78, 2001, pp. 2876-2878.

S.J. Hong and K. Kim, "Low-resistance Ohmic contacts for high-power GaN field-effect transistors obtained by selective area growth using plasma-assisted molecular beam epitaxy", Appl. Phys. Letters 89, (2006), pp. 042101-1 to 04210-3.

J. S. Moon, D. Wong, M. Hu, P. Hashimoto, M. Antcliffe, C. McGuire, M. Micovic, and P. Willadson, "55% PAE and High Power Ka-Band GaN HEMTs With Linearized Transconductance via n+GaN Source Contact Ledge", IEEE Electron Device Letters, vol. 29, No. 8, Aug. 2008, pp. 834-837.

Shinohara, "Scaling of GaN HEMTs and Schottky Diodes for Submillimeter-Wave MMIC Applications," published in IEEE Transactions on Electron Devices, vol. 60, No. 10, Oct. 2013, pp. 2982-2996.

From U.S. Appl. No. 13/907,704, filed May 31, 2013 and Office Actions including but not limited to the Office Action mailed on Mar. 11, 2014.

From U.S. Appl. No. 13/310,473 (now U.S. Pat. No. 8,558,281), Application and Office Actions including but not limited to the Office Actions mailed on Nov. 14, 2012, Jan. 28, 2013, and Jun. 6, 2013.

From U.S. Appl. No. 13/968,185, filed Aug. 15, 2013 and Office Actions including but not limited to the Office Action mailed on Dec. 6, 2013.

Ho, et al., "Monolithic Integration of HEMTS and Shottky Diodes for Millimeter Wave Circuits," GaAs IC Symposium Proceedings, Proceedings, p. 301-304, 1988.

Micovic, et al., "GaN HFET for W-band Power Applications", Electron Devices Meeting IEDM p. 1-3 (2006).

Shinohara, K., et al."GaN HEMTS and Schottky Diodes for Sub-Millimeter-Wave MMICs". IMS/RFIC2013 Workshop, Washington State Convention Center, Seattle, WA. Jun. 3, 2013.

Shinohara, K., et al."Self-Aligned-Gate GaN-HEMTs with Heavily-Doped n+-GaN Ohmic Contacts to 2DEG" Dec. 2012.

From U.S. Appl. No. 14/464,077 (unpublished; non publication requested), Office Action mailed on Oct. 6, 2015.

From U.S. Appl. No. 13/907,704 (now published as U.S. Pat. No. 8,946,724), Notice of Allowance mailed on Sep. 29, 2014.

From U.S. Appl. No. 13/907,704 (now published as U.S. Pat. No. 8,946,724), Notice of Allowance mailed on Jun. 6, 2014.

From U.S. Appl. No. 13/907,704 (now published as U.S. Pat. No. 8,946,724), Office Actin mailed on Mar. 11, 2015.

U.S. Appl. No. 14/464,077, filed Aug. 20, 2014, Shinohara.

* cited by examiner

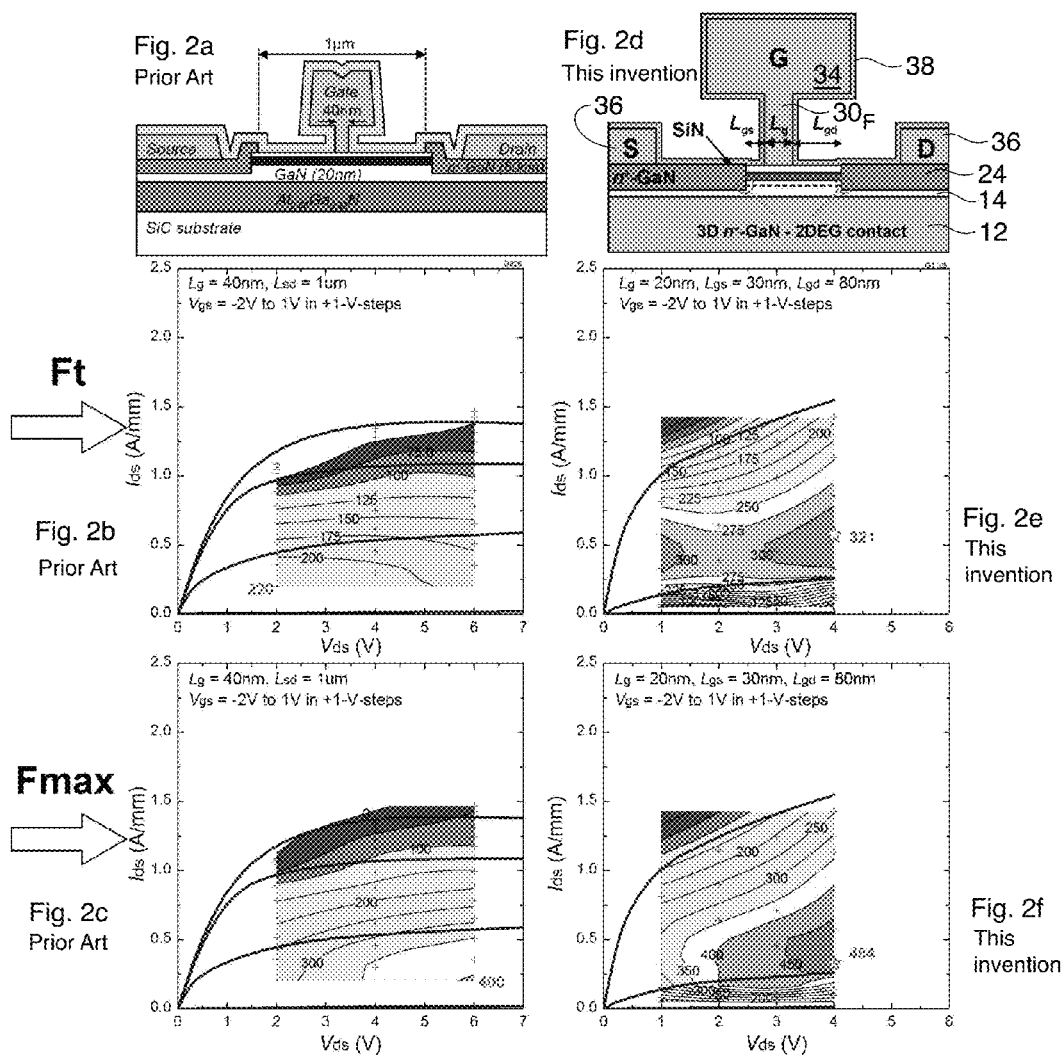

US 9,449,833 B1

METHODS OF FABRICATING SELF-ALIGNED FETS USING MULTIPLE SIDEWALL SPACERS

CROSS REFERENCE TO RELATED APPLICATIONS

This application claims the benefit of U.S. Provisional Patent Application No. 61/772,753 filed Mar. 5, 2013, the disclosure of which is hereby incorporated herein by reference.

This application is related to U.S. patent application Ser. No. 12/792,529 filed Jun. 2, 2010 and entitled "Apparatus and Method for Reducing the Interface Resistance in GaN Heterojunction FETs", the disclosure of which is hereby incorporated by reference.

STATEMENT REGARDING FEDERALLY SPONSORED RESEARCH OR DEVELOPMENT

This invention was made under US Government Contract No. HR0011-09-C-0126 and therefore the US Government may have certain rights in this invention.

TECHNICAL FIELD

This invention relates to the fabrication of FETs, including HEMTs, using a self-aligned process.

BACKGROUND

Next-generation field effect transistors (FETs) require aggressive scaling of device dimensions to reduce device delays, access resistances, and parasitic capacitances for improved high-frequency performance. In particular, ultra-short nanometer-scale gate length and source-drain spacing are required in a robust, high throughput, reproducible, and reliable process.

Conventional, fabrication techniques for high-frequency FETs (and particularly for HEMTs) use e-beam lithography, metal evaporation and lift-off for forming a T-shaped gate structure. However, the aspect ratio (defined by the ratio of height and length of the gate foot, =h/Lg) of lithographically-defined gates is limited, decreasing the gate head-to-channel distance and giving rise to parasitic capacitances in the devices fabricated using this prior art technique. Furthermore, device uniformity, yield, and minimum gate length relies on alignment accuracy and resolution of e-beam lithography tool, limiting minimum dimensions of scaled devices.

BRIEF DESCRIPTION OF THE INVENTION

In one aspect the present invention relates to a method of making a transistor with a self-aligned asymmetrically located stem of a T-shaped gate, the method including the steps of: forming a plurality of layers over a substrate, at least one of said plurality of layers being a layer which will become a channel of said transistor; forming a sacrificial gate above said layer which will become said channel, the sacrificial gate having a given width; forming a sacrificial sidewall disposed on only one side of said sacrificial gate, the sacrificial sidewall having a width which when added to the given width of the sacrificial gate will define a spacing between yet to be formed source and drain contacts; using the sacrificial gate and the sacrificial sidewall on only one said of said sacrificial gate as an etch mask and etching unmasked portions of at least some of said plurality of layers whereby the etching results in a partial etching of the layer which will become said channel; forming said source and drain contacts on the partial etching of the layer which will become said channel; forming a mask over said source and drain contacts and laterally of said sacrificial gate and the sacrificial sidewall formed on only one said of said sacrificial gate; removing the sacrificial gate, but allowing the sacrificial sidewall to at least temporally remain, the removed sacrificial gate defining an opening between an edge of said mask and said sacrificial sidewall; forming a pair of additional sidewall spacers on opposing sides of said opening; forming a metallic structure between said pair of sidewall spacers, the metallic structure forming said stem, the stem being locationally defined with respect to the drain and source contacts by the widths of (1) said sacrificial sidewall formed on only one said of the sacrificial gate and (2) said pair of additional sidewall spacers; and forming a gate head on said stem.

In another aspect the present invention relates to a method of making a device having a T-shaped gate, the T-shaped gate having a stem portion, the method comprising locating said stem portion relative to drain and source contacts of said device by forming a plurality of sidewall spacers, with more sidewall spacers being formed on one side of said stem portion than are formed on an opposing side of said stem portion.

In another aspect the present invention relates to a device having a T-shaped gate which is located relative to drain and source contacts of said device by sidewall spacers, the device having more sidewall spacers on one side of said T-shaped gate than on an opposing side of said T-shaped gate. Preferably, the drain and source contacts comprise a highly doped semiconductor material. And again preferably, the stem of said T-shaped gate and the drain and source contacts are each disposed on a common layer of material forming a channel layer of said device.

BRIEF DESCRIPTION OF THE DRAWINGS

FIG. 2a depicts a conventional T-gate GaN-HEMT while FIG. 2d depicts a GaN-HEMT with an asymmetric self-aligned-gate of an embodiment of the present invention.

FIGS. 2b and 2c are graphs of measured cutoff frequencies (Ft and Fmax) of the conventional device of FIG. 2a, while FIGS. 2e and 2f are graphs of measured cutoff frequencies (Ft and Fmax) of a asymmetrical device of FIG. 2d.

DETAILED DESCRIPTION

Figure 1A:
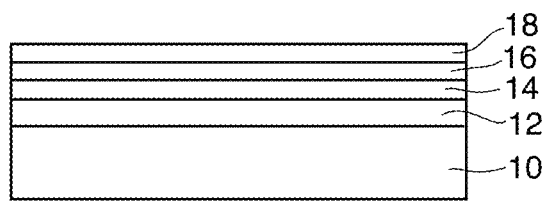
FIGS. 1a-1r depict steps of a fabrication process which may be used to make a asymmetric self-aligned sidewall gate device in accordance with an embodiment of the present invention.
Figure 1B:
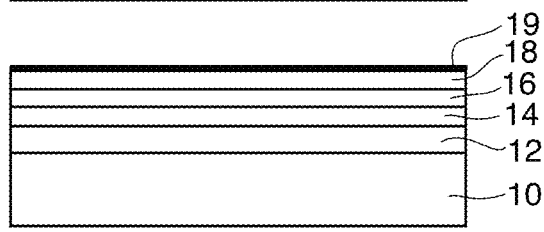
FIG. 1s depicts a symmetric self-aligned sidewall gate device in accordance with another embodiment of the present invention which can be attained by omitting certain steps otherwise utilized to make the asymmetric self-aligned sidewall gate device embodiment for FIGS. 1a-1r.
Figure 1C:
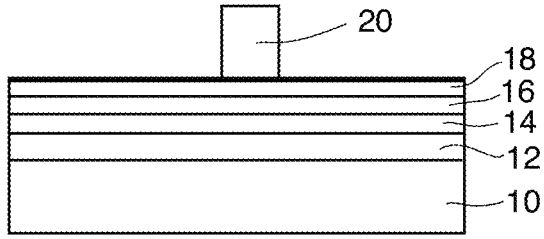
Figure 1D:
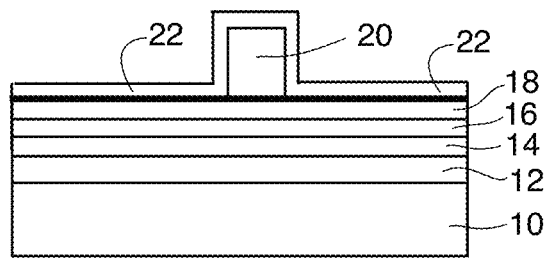
Figure 1E:
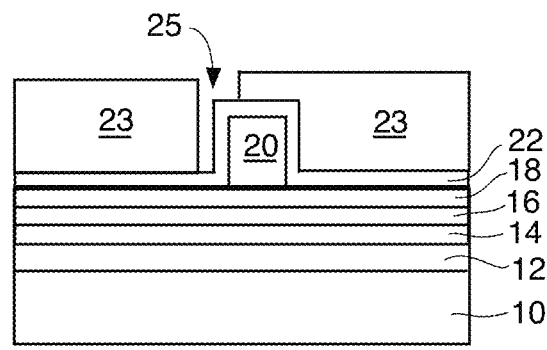
Figure 1F:
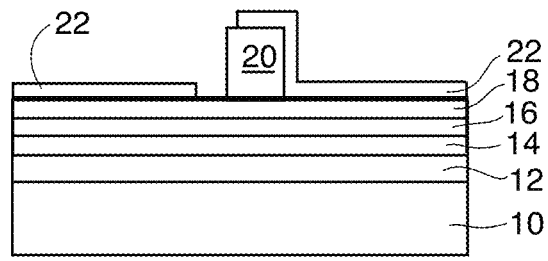
Figure 1G:
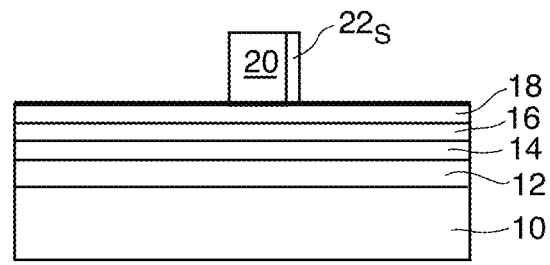
Figure 1H:
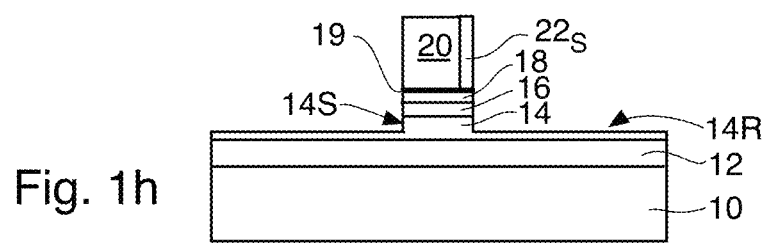
Figure 1I:
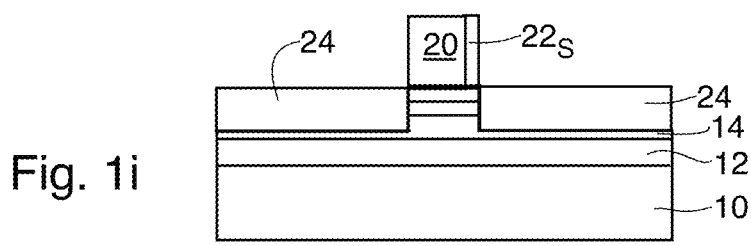
Figure 1J:
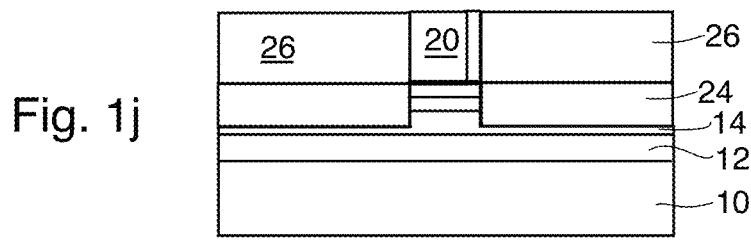
Figure 1K:
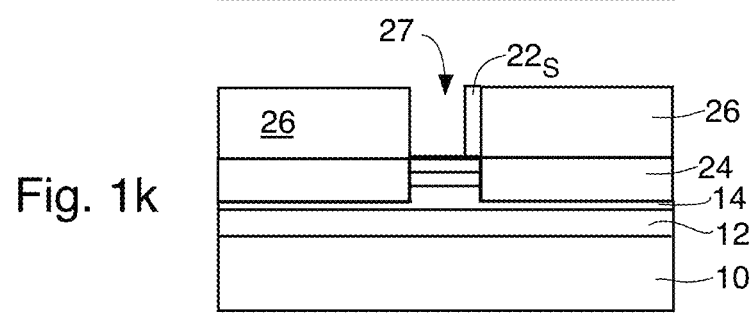
Figure 1L:
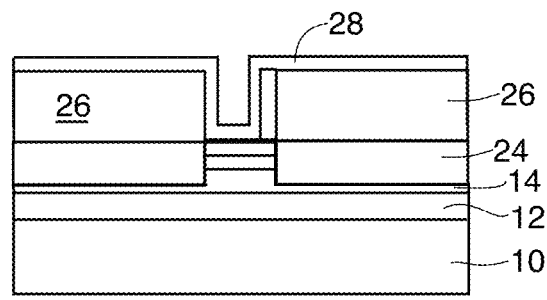
Figure 1M:
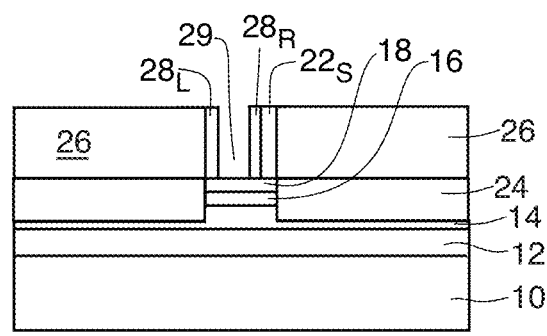
Figure 1N:
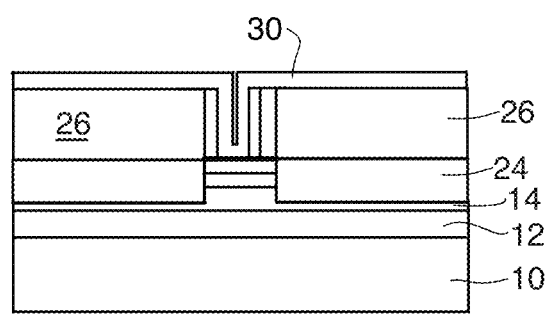
Figure 1O:
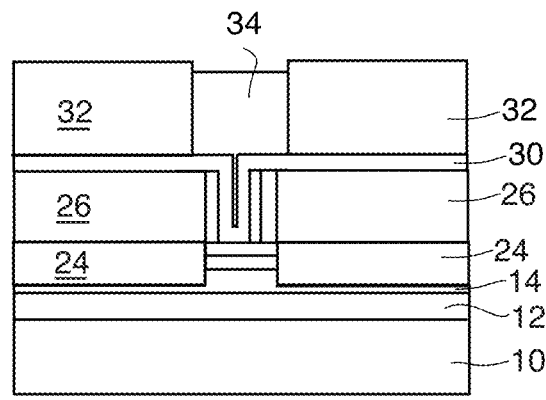
Figure 1P:
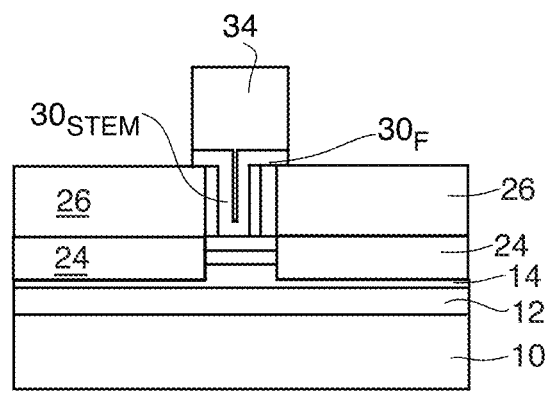
Figure 1Q:
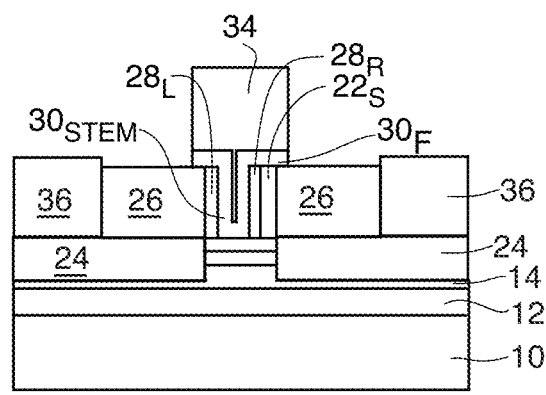
Figure 1R:
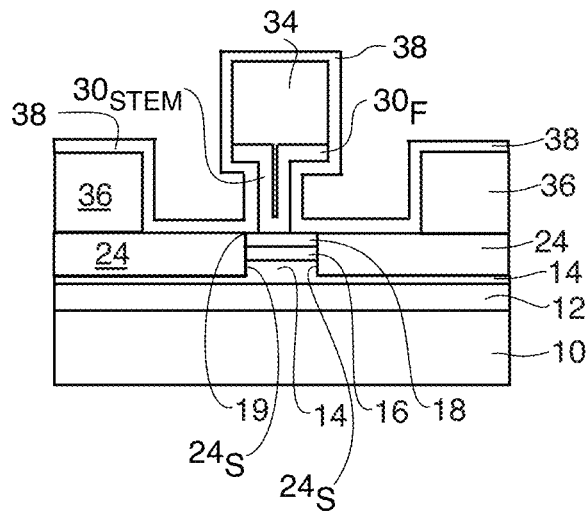

FIGS. 1a-1r show a fabrication process as a sequence of steps which may be used to make a asymmetric (non-symmetric) self-aligned gate stem of a device in accordance with an embodiment of the present invention. This process particularly illustrates a process flow for GaN-based HEMT, but it is not limited to GaN but is applicable to other III-V semiconductor material systems such as GaAs, InP, InSb, InGaAs, InAs, GaSb, AlGaN, or InN to name a few. The preferred sequence of fabrication steps is described below.

As shown in FIG. 1a, an embodiment of a GaN-HEMT structure is grown epitaxially preferably by Molecular Beam Epitaxy (MBE) or Metal Organic Chemical Vapor Deposition (MOCVD) on a suitable substrate 10, such as sapphire, SiC, silicon, GaN, etc. The HEMT epitaxial layers preferably comprise an AlGaN back barrier layer 12 disposed on substrate 10, a GaN channel layer 14 disposed on back barrier layer 12, an AlGaN top barrier layer 16 disposed on channel layer 14, and finally an optional epitaxial cap layer 18 applied over the top barrier layer 16 comprising either AlGaN or GaN, all of which layers 12-18 are preferably grown by MBE or MOCVD. Other suitable materials may be utilized for these layers. For example, back barrier layer 12 can alternatively be GaN or InGaN/GaN, channel layer 14 can alternatively be InGaN, AlGaN, or InAlGaN (or combinations thereof) and top barrier layer 16 can alternatively be AN or InAlN. The thickness of layer 16 is preferably about ⅕ of the gate length of the HEMT to suppress the short channel effect. The thickness of the layer 14 preferably ranges from about 3 nm to about 40 nm while the thickness of layer 16 preferably ranges from about 1 nm to about 20 nm.

A Two Dimensional Electron Gas (2DEG—see the dashed line in FIG. 2d) occurs in the channel layer 14 due to a polarization effect caused by the top barrier layer 16 or a combination of the top barrier layer 16 and the optional epitaxial cap layer 18. The 2DEG channel is formed immediately at interface between layer 14 and layer 16 as soon as the top barrier 16 is disposed of on top of layer 14 as shown in FIG. 1a.

As shown in FIG. 1b a dielectric layer 19, such as $SiO_2$, SiN, etc., may optionally be applied on top of the optional cap layer 18 (or on top of the top barrier layer 16 if no cap layer is used) using a deposition technique such as plasma enhanced chemical vapor deposition (PECVD) or atomic layer deposition (ALD). Dielectric layer 19 may be used to protect the semiconductor surface (either layer 16 and/or layer 18) thereby preventing a reaction between layer 22 and layer 18 (or layer 22 and layer 16) during the ohmic regrowth step described with reference to FIG. 1j below. A reaction between layer 22 and layer 18 (or layer 16) can form an undesirable current leakage path at the interface. The insertion of a dielectric layer 19 prevents a leakage current from occurring between the gate and the source or the gate and the drain, through this interface, and therefor the use of a dielectric layer 19 is preferred.

Initial patterning is accomplished by laying down a layer of a EBeam resist (preferably hydrogen silsesquioxane (HSQ) is used as the EBeam resist) which is patterned into an island 20 of EBeam resist preferably using E-beam lithography to define the island 20 as shown by FIG. 1c. The thickness of the island 20 is preferably about 3500 Å, while the width of the island 20 (which, as will be seen, helps control the width of the stem of a T-shaped gate) typically should range from about 60 nm to about 200 nm. If desired, $SiO_2$ may be used instead of HSQ as the material to form island 20, but the use of $SiO_2$ will likely involve additional processing steps compared to using HSQ in order to form island 20 as is described herein.

Next a sacrificial dielectric layer 22 such as Si, $SiO_2$, SiN, SiON, $Al_2O_3$, $HfO_2$, ZrO, $TiO_2$, using a deposition technique such as chemical vapor deposition (CVD) or ALD, is applied over the exposed structure of FIG. 1c resulting in the structure shown by FIG. 1d. This layer 22 will be used to define a sidewall $22_S$ (as explained below—see FIG. 1k) on one side of the stem of the T-shaped gate which sidewall $22_S$ is used to offset the position of the stem asymmetrically. So when forming the sacrificial dielectric layer 22, its thickness (equal to the width of the sidewall $22_S$) will be used in controlling the size or extent of that offset. The thickness of layer 22 should preferably be in the range of 50 nm to 300 nm.

A mask layer 23 (preferably a PMMA resist) is applied over the structure of FIG. 1d and lithographically patterned preferably using electron beam lithography to define an opening 25 as shown in FIG. 1e. Then the SiN layer 22 visible through opening 25 is etched away preferably using an isotropic dry etch—such as a Reactive Ion Etch (RIE) or an Inductively Coupled Plasma REI (ICP-RIE) etch technique, preferably using a $CF_4$ and $O_2$ gas mixture—through the opening 25 in the resist mask layer 23. This etch may cause layer 22 to etch away partially (not shown in the FIG. 1g) and is preferably timed to not cause any damage to layer 16.

The structure of FIG. 1f is preferably first subjected to an isotropic RIE/ICP RIE etch by a $CF_4/O_2$ gas mixture at high pressure (e.g., 90 mTorr in the etch chamber) to partially etch away layer 22 followed by anisotropic RIE/ICP RIE etch by $CF_4$ gas at a low pressure (e.g., 3 mTorr in the etch chamber) to etch what remains of the SiN layer 22 vertically, leaving behind a sidewall $22_S$ of SiN disposed preferably on the drain side of the gate, as shown in FIG. 1g. This etch will etch island 20 slightly in a vertical direction; however, the lateral width of island 20 will not be changed due by any vertical etching caused by this anisotropic RIE/ICP RIE etch. The resist mask layer 23 is then removed as depicted in FIG. 1f using a suitable mask remover.

The sidewall $22_S$ on what will be the drain side of the gate which is preferably all that remains of the original SiN layer 22 in this embodiment after the isotropic and anisotropic etches of the SiN layer 22 as described above. However, after the processing shown and described with reference to FIG. 1g, the same processing occurring between FIG. 1d and FIG. 1g can be repeated (and modified as need be) to form additional sidewalls on the left-side of the island 20 and on the right-side of sidewall $22_S$, which additional sidewalls can be used to control an electric field profile between the gate and the source as well as the gate and the drain to increase breakdown voltage or control gate capacitances for improved high frequency performance of the resulting device.

As can be seen by comparing FIG. 1f with FIG. 1g, layers 19, 18, and 16 are next etched away while layer 14 is partially etched in FIG. 1g. An etch depth of 300 Å is targeted using a dry etch, preferably a RIE/ICP RIE etch with a $Cl_2$ gas etchant, which removes layers 19, 18, 16, and partially etches layer 14 using island 20 and its sidewall $22_S$ as a mask. Layer 14 should preferably be partially removed (its thickness is reduced where not protected by island 20 or sidewall $22_S$) so that contacts 24 of an n+ material can be formed (see FIG. 1i and the discussion below) and make contact to the 2DEG channel of layer 14. The upper exposed portion of channel layer 14 after being reduced in thickness is labeled 14R in FIG. 1h. Moreover the partial etching of channel layer 14 causes a step change in its thickness 14S to occur at the lateral edges of the mask formed by island 20 and its sidewall $22_S$.

Contacts 24 are formed by selective regrowth of an n+ material (preferably n+GaN). The n+ material (preferably n+GaN) contacts 24 produce lower contact resistances than do conventional alloyed metal contacts and also enable shorter source to drain/gate to gate distances than do conventional alloyed metal contacts. The n+ material (preferably n+GaN) 24 is preferably heavily (or highly) doped with Si (preferably doped with a doping level greater than $5 \times 10^{19}$ cm$^{-3}$) and therefore the heavily (or highly) doped n+ material has a very low resistance allowing it to function as a contact, namely, as a drain contact on the drain side (to the right of island 20 in FIG. 1i) and as a source contact on the source side (to the left of island 20 in FIG. 1i). Due to the low resistance of the Si-doped n+GaN preferably used for contacts 24, the electric field is mostly confined in between the gate and the n+GaN on the drain side of the gate; therefore, a gate-to-drain dimension ($L_{gd}$—See FIG. 2d) is defined by the presence of the Si-doped n+GaN 24 on the drain side of the gate.

The n+ material (preferably n+GaN) contacts 24 make contact with layer 14 both where layer 14 is reduced in thickness (see reference numeral 14R in FIG. 1h) and by butting against layer 14 where the step change in thickness occurs (see reference number 14S in FIG. 1h). Contacts 24 may be formed of materials such as n+GaN, n+InN, n+InGaN and may be formed by MBE or MOCVD. And, as will be seen, metal contacts 36 will be preferably formed on the n+ material contacts 24 during later processing steps. The tops of the n+ material contacts 24 seem to align perfectly with the base of island 20 in FIG. 1i. In practice, the thickness of the n+ material contacts 24 depends the growth rate and growth time of the n+ material and such perfect alignment does not occur. Indeed, we prefer it if the thickness of the n+ material contacts 24 extends about 10 nm above the base of island 20. Then a dielectric layer 26 is deposited, which dielectric layer 26 may comprise Si, SiON, HFO$_2$, ZrO, TiO$_2$, using a deposition technique such as CVD, sputtering, ALD, etc, to a desired thickness which allows for planarization & CMP (Chemical Mechanical Polishing) to planarize the surface to form a smooth outer surface which can seen in FIG. 1j. An annealing step may be optionally used to condense the layer 26 to inhibit it from being significantly etched during the wet etching of island 20 which preferably occurs next. The previously formed sacrificial gate island 20 is removed, preferably by a wet etch, leaving an opening 27 (see FIG. 1k), but this wet etch preferably does not etch the sidewall $22_S$ formed from dielectric layer 22 or layer 26 in any significant way.

A dielectric layer 28, preferably formed of SiO$_2$ and/or SiN is then formed, preferably by PECVD or ALD, on the exposed surface of the structure shown in FIGS. 1k and 1n the previously defined opening 27, as depicted in FIG. 1l. Layer 28 will be used to form a pair of gate sidewall spacers preferably using an anisotropic dry etch (preferably ICP-RIE) to define the two sidewalls (see sidewalls $28_L$ and $28_R$ in FIG. 1m) from the previously deposited dielectric layer 28. This etch (the anisotropic ICP-RIE) also preferably removes layer 19 (if used). This anisotropic etch only etches layer 28 (leaving the new sidewall spacers $28_L$ and $28_R$ behind) and layer 19 (if used) while not etching layer 18 or layer 16 (if optional layer 18 is not utilized) exposing an gatefoot opening 29. The thickness of layer 28 should generally be in the range of 10 nm to 100 nm. The anisotropic dry etch is preferably ICP-RIE, using CF$_4$, CHF$_3$, or SF$_6$ gas or some combination thereof as the etchant at a chamber pressure of 3 mTorr at room temperature.

The thickness of layer 22 typically ranges between 50 nm and 300 nm while the thickness of layer 28 typically ranges between 10 nm and 100 nm. The thicknesses of layers 22 and 28 dictate the width of spacers $22_S$, $28_L$ and $28_R$ shown, for example, in FIG. 1m. The widths selected for these spacers (and hence the thicknesses of layers 22 and 28) will depend on a number of factors, including (i) the width of the gate stem $30_{STEM}$ (and hence the aspect ratio of the gate stem $30_{STEM}$—discussed in the following paragraph), (ii) the width of layers 16 and 18 at the gate foot, and (iii) the degree of asymmetry in terms of the gate stem's location relative to the drain and source contacts 24. As such, the thicknesses of layers 22 and 28 may fall outside the "typical" ranges given above.

The gate foot opening 29 is then metalized by thermal or plasma enhanced ALD using metals such as Pt, Ir for the metalization 30 as depicted by FIG. 1n to form metal on the previously exposed portion of the upper barrier layer 16 (or layer 18 if it exists), which metal extends upwardly forming the stem of what will be a T-shaped gate. A very narrow gap can be seen in stem which gap is a possible byproduct of using ALD to form the stem of the gate. If the gate metal is deposited with the thickness more than 2× of the size of the gap between sidewalls $28_L$ and $28_R$, then the depicted narrow gap in the stem is completely eliminated. But if the narrow gap does occur, that gap is later filled with metal (Au) as shown in FIG. 1o, when gate head 34 of the T-shaped gate is formed. Either way the resulting stem $30_{STEM}$ (see, for example, FIG. 1p) can have a high aspect ratio (stem height divided by its width) greater than 10-20 when ALD is used to form the gate stem $30_{STEM}$. A high aspect ratio stem (greater than 10) is desirable since that moves gate metal (particularly the gate head 34 discussed in the next paragraph) away from the semiconductor layers (such as the channel layer 14) thereby reducing capacitance between the gate and the semiconductor layers. Using ALD, as discussed herein, to form the gate stem $30_{STEM}$ allows for much taller gate heights with reduced gate stem widths compared to prior art T-shaped gate construction techniques.

As can be seen by reference to FIG. 1o, the gate head 34 is next formed by first applying a mask 32, preferably a PMMA mask, which is patterned using lithographic techniques and an opening formed therein which is then metalized preferably by electro plating using the previously formed metal 30 in the gatefoot opening 29 as plating base for this added, new metal which forms the gate head 34. Gate head 34 may be formed of Au and that metal will typically fill in any gap occurring in the stem of the gate. The mask 32 is then removed by a resist remover (stripper) such as Acetone or N-Methylpyrrolidone (NMP). Then the exposed portions of layer 30 are removed by ion-milling, resulting in the structure depicted by FIG. 1p with the metallic gate foot $30_F$ comprising the remaining portion of layer 30, particularly the remaining portion of layer 30 which defines the stem $30_{STEM}$ of a T-shaped gate.

Turning to FIG. 1q, openings for ohmic contacts 36 are preferably defined by first forming openings in dielectric layer 26 using a mask defined using standard lithographic techniques and then employing a RIE/ICP-RIE etch to cut the openings into the dielectric layer 26. Those openings are then filled with metal using standard lithographic techniques, metal evaporation, and lift-off. The metal preferably consists of Au on top of Pt. The gate head is protected with photoresist (not shown) used for the just mentioned mask as the photoresist preferably covers the gate head layer 34 during the opening etching process, as well as the ohmic metal evaporation and lift-off processes used to form the ohmic contacts 36.

Figure 1S:
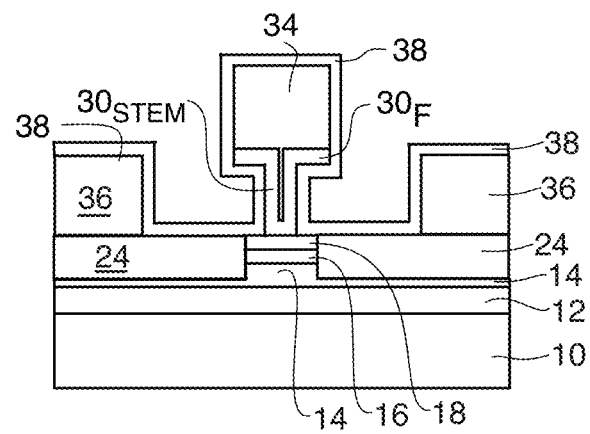

The sidewall spacer $22_S$, sidewall spacers $28_L$ and $28_R$ and the remaining portions of layer 26 are then preferably removed preferably by a wet etch and a gate dielectric passivation layer 38, preferably formed of SiN, or Al$_2$O$_3$, or HfO$_2$, or AlN, is then preferably formed over the exposed surfaces preferably by plasma enhanced chemical vapor deposition or atomic layer deposition (ALD) as depicted in FIG. 1s. Since the these layers are all dielectric, they could remain in the finished device, but their presence would then add some capacitance to the resulting device which is likely to be considered as being undesirable in most applications of he device.

It should be noted that the stem $30_{STEM}$ of the gate foot $30_F$ is disposed asymmetrically with regard to the sides $24_S$ of the n+ regrown layer 24 as can be seen in FIG. 1r. This is due to the fact that more sidewall spacers 22, $28_R$ (two in this embodiment) are formed on the right hand side of the gatefoot 29 than are formed on the left hand side of the gatefoot 29 (where only one sidewall spacer $28_L$ is formed in this embodiment). Of course, the processing described can also form a mirror image of that which is shown in FIG. 1p with more spacers on the left than occur on the right hand side of FIG. 1p and the processing described can also form a symmetric structure by eliminating the sidewall $22_S$. It important, in these asymmetrical embodiments, to have the gate foot (stem) disposed asymmetrically with respect to the sides $24_S$ of layer 24 so that a relatively short gate-to-source distance (the distance between the gatefoot and the left side of layer 24 in this embodiment) is used to reduce the source resistance, to increase the drain current, while the relatively longer gate-to-drain distance (distance between the gate foot and the right side of layer 24) is used to increase the breakdown voltage, reduce the gate-to-drain capacitance, and reduce the drain conductance.

Skipping the process steps described with reference to FIGS. 1d-1g (so that that the sidewall spacer $22_S$ shown, for example, in FIG. 1g is not formed) enables the formation of a symmetric self-aligned gate stem as shown in FIG. 1r. The symmetric gate process is suitable for applications such as low-noise amplifier where a very low device on-resistance is required. When the gate stem is symmetric, the breakdown voltage is not as high as the asymmetric gate stem with the relatively longer gatestem-to-drain distance (compared to the gatestem-to-source distance). However the symmetric device has smaller drain resistance and a higher cutoff frequency than the asymmetric device, which makes the device more suitable for low DC power, low-noise amplifier applications.

One advantage of the present invention which is applicable to both the asymmetric embodiment of FIG. 1r and the symmetric embodiment of FIG. $1_S$, is that the location and width of the stem $30_{STEM}$ of the T-shaped gate is both aligned and controlled by the width of the island 20 and the thicknesses of layer 22 (if used) and layer 28.

FIG. 2a depicts a conventional T-gate GaN-HEMT while FIG. 2d depicts a GaN-HEMT with an asymmetric self-aligned-gate formed as described above. Under these two figures are graphs of measured cutoff frequencies (Ft and Fmax). FIGS. 2b and 2c are graphs of measured cutoff frequencies (Ft and Fmax) of the conventional device, while FIGS. 2e and 2f are graphs of measured cutoff frequencies (Ft and Fmax) of a asymmetrical (non-symmetrical) device made in accordance with FIGS. 1a-1r. The new asymmetrical device of FIG. 2d shows much improved Ft/Fmax in wide range of drain voltage (Vds) and drain current (Ids), clearly demonstrating advantages of the new device structure and method of making same disclosed herein. The measurements shown in FIGS. 2e and 2f are based on fabricated devices (as opposed to simulations).

In FIG. 2d, $L_{gd}$ equals the thickness of layer 28 (which is also equal to the width of sidewall $28_L$, see also FIG. 1m). $L_{gd}$ equals (i) the thickness of layer 28 (which is also equal to the width of sidewall $28_R$) plus (ii) the thickness of layer 22 (which is also equal to the width of the additional sidewall $22_S$). $L_g$ equals the width of the gate foot opening 29. As described above, a longer gate-to-drain distance ($L_{gd}$) compared to the gate-to-source distance ($L_{gs}$) is utilized to increase breakdown voltage of the asymmetrical gate stem GaN-HEMT disclosed herein. The thickness of layer $22_S$ equals to the difference between $L_{gs}$ and $L_{gd}$ as the thicknesses of $28_L$ and $28_R$ are the same in the disclosed embodiment where layer 22 is formed in a single step according to the embodiment disclosed herein. The location of the stem $30_{STEM}$ of the gate is self-aligned as it is controlled by the thicknesses of layers 22 and 28, while location of n+GaN ohmic contacts 24 is controlled by the thickness of layer 22.

Incorporated by reference herein (and attached as Appendix A) is a paper entitled "Scaling of GaN HEMTs and Schottky Diodes for Submillimeter-Wave MMIC Applications" published in IEEE Transactions on Electron Devices, vol. 60, no. 10, October 2013, pp. 2982-2996, after the filing date (Mar. 5, 2013) of the provisional application to which benefit is claimed above.

An important feature of the asymmetrical gate stem is the formation of more (preferably two) sidewall spacers on one side (preferably the drain side) of the gate stem and fewer (preferably one) sidewall spacer on the other side (preferably the source side) of the gate stem. In the method described above, a single sidewall spacer (22s) is formed immediately after island 20 is defined and then two sidewall spacers ($28_L$ and $28_R$) are defined after the island 20 is removed. Of course this process could be modified to form one sidewall spacer on the source side of the island 20 and two sidewall spacers on the drain side the island 20 (before the island is removed), in which embodiment then there would be no need to form additional sidewall spacers after the island 20 is removed (although they could be formed, in which case the number of sidewall spacers on one side of the gate stem would still be different than the other side). And in yet another embodiment, the process described above with reference to FIGS. 1a-1r could be modified to form one sidewall spacer on the source side after the island 20 is removed and two sidewall spacers on the drain side after the island 20 is removed, in which case there would be no need to form a single sidewall spacer next to the island 20 (before it is removed).

This concludes the description including preferred embodiments of the present invention. The foregoing description including preferred embodiments of the invention has been presented for the purposes of illustration and description. It is not intended to be exhaustive or to limit the invention to the precise forms and methods disclosed. Many modifications and variations are possible within the scope of the foregoing teachings. Additional variations of the present invention may be devised without departing from the inventive concept as set forth in the following claims.

What is claimed is:

1. A method of making a transistor having a stem of a gate which is asymmetrically disposed relative to source and drain contacts of the transistor, the method including forming sidewall spacers and utilizing the sidewall spacers to position the stem relative to the source and drain contacts of the transistor, the method characterized in that (i) a greater number of sidewall spacers are formed on a drain side of the stem of the gate than are formed on a source side of the stem of the gate asymmetrically disposing the stem of the gate relative to the source and drain contacts; (ii) each said spacer has an essentially constant width so that the stem of the gate is vertically disposed having stem sidewalls positioned laterally of the source and drain contacts by constant distances; and (iii) the sidewall spacers disposed closest to the stem of the gate have a common width.

2. The method of claim 1 wherein each of the sidewall spacers has a direction of elongation which parallels a direction of elongation of a major axis of the stem portion.

3. The method of claim 1 wherein the greater number of the sidewall spacers used on the drain side of the stem of the gate are all positioned laterally between the drain contact and the stem of the gate in a side by side orientation.

4. The method of claim 1 wherein the greater number the of sidewall spacers used on the drain side of the stem of the gate each have a major axis which essentially parallels a major axis of the stem of the gate.

5. A method of making a device having a T-shaped gate, the T-shaped gate having a stem portion with vertical sidewalls, the method comprising locating the vertical sidewalls of the stem portion relative to drain and source contacts of the device by forming a number of sidewall spacers each having vertical sidewalls, with a greater number of sidewall spacers being formed on one side of the stem portion than are formed on an opposing side of the stem portion asymmetrically disposing the stem of the gate relative to the drain and source contacts, each of the sidewall spacers having a direction of elongation which parallels a direction of elongation of a major axis of the stem portion, the vertical sidewalls of two of the sidewall spacers forming an opening having vertical sidewalls, and depositing metal in the opening, the metal deposited in the opening forming the stem of the T-shaped gate.

6. The method of claim 5 wherein the source and drain contacts comprise a semiconductor material, the semiconductor material having a doping level greater than $5 \times 10^{19}$ cm$^{-3}$.

7. The method of claim 5 wherein the stem portion of the T-shaped gate and the drain and source contacts are each disposed next to a common layer of material forming a channel layer of the device, the drain and source contacts being disposed on one portion of the common layer and laterally of another portion of the common layer and the stem portion being disposed over the common layer.

8. The method of claim 5 wherein the sidewall spacers disposed closest to the stem of the gate have a common width.

9. The method of claim 5 wherein the greater number of the sidewall spacers used on the drain side of the stem of the gate are all positioned laterally between the drain contact and the stem of the gate in a side by side orientation.

10. The method of claim 5 wherein the greater number of the sidewall spacers used on the drain side of the stem of the gate each have a major axis which essentially parallels a major axis of the stem of the gate.

11. A method of making a transistor with a self-aligned asymmetrically located stem of a T-shaped gate, the method including the steps of:
   i. forming a plurality of layers over a substrate, at least one of said plurality of layers being a layer which will become a channel of said transistor;
   ii. forming a sacrificial gate above said layer which will become said channel, the sacrificial gate having a given width;
   iii. forming a sacrificial sidewall disposed on only one side of said sacrificial gate, the sacrificial sidewall having a width which when added to the given width of the sacrificial gate will define a spacing between yet to be formed source and drain contacts;
   iv. using the sacrificial gate and the sacrificial sidewall on only one side of said sacrificial gate as an etch mask and etching unmasked portions of at least some of said plurality of layers whereby the etching results in a partial etching of the layer which will become said channel;
   v. forming said source and drain contacts on the partial etching of the layer which will become said channel;
   vi. forming a mask over said source and drain contacts and laterally of said sacrificial gate and the sacrificial sidewall formed on only one side said of said sacrificial gate;
   vii. removing the sacrificial gate, but allowing the sacrificial sidewall to at least temporally remain, the removed sacrificial gate defining an opening between an edge of said mask and said sacrificial sidewall;
   viii. forming a pair of additional sidewall spacers on opposing sides of said opening;
   ix. forming a metallic structure between said pair of sidewall spacers, the metallic structure forming said stem, the stem being locationally defined with respect to the drain and source contacts by the widths of (1) said sacrificial sidewall formed on only one side of said sacrificial gate and (2) said pair of additional sidewall spacers; and
   x. forming a gate head on said stem.

12. The method of claim 11 wherein said plurality of layers comprising a substrate, a back barrier layer disposed on said substrate, the layer which will become the channel of said transistor being disposed on said back barrier layer and a top barrier layer being disposed on at least portion of the layer which will become the channel of said transistor.

13. The method of claim 12 wherein the substrate is selected from the group consisting of sapphire, SiC, silicon, and GaN.

14. The method of claim 13 wherein the back barrier layer is selected from the group consisting of AlGaN, GaN and InGaN/GaN.

15. The method of claim 14 wherein the layer which will become a channel of said transistor is selected from the group consisting of GaN, AlN and InAlN.

16. The method of claim 1 wherein said source and drain contacts are formed by a n type semiconductor material, said n type semiconductor material having a doping level greater than $5 \times 10^{19}$ cm$^{-3}$.

17. The method of claim 1 wherein the metallic structure forming said stem is formed by Atomic Layer Deposition (ALD) and results in a stem having an aspect ratio greater than 10 to thereby reduce capacitance between the gate and said layer which will become the channel of the transistor.

18. A method of making a transistor with a self-aligned stem of a T-shaped gate, the method including the steps of:
   i. forming a plurality of layers over a substrate, at least one of said plurality of layers being a layer which will become a channel of said transistor;
   ii. forming a sacrificial gate above said layer which will become said channel, the sacrificial gate having a given width;
   iii. using the sacrificial gate as an etch mask and etching unmasked portions of at least some of said plurality of layers whereby the etching results in a partial etching of the layer which will become said channel;
   iv. forming said source and drain contacts on the partial etching of the layer which will become said channel and immediately adjacent the sacrificial gate;
   v. forming a mask over said source and drain regions;

vi. removing the sacrificial gate to thereby define an opening in said mask;
vii. forming at least a pair of sidewall spacers on opposing sides of said opening;
viii. forming a metallic structure between said pair of sidewall spacers, the metallic structure forming said stem, the stem being locationally defined with respect to the drain and source contacts by the widths of said pair of sidewall spacers; and
ix. forming a gate head on said stem.

19. The method of making a transistor with a self-aligned stem of a T-shaped gate of claim 18, the method further including the step of forming a sacrificial sidewall disposed on only one side of said sacrificial gate, the sacrificial sidewall having a width which together with the widths of said pair of sidewall spacers causes said stem to be asymmetrically located with respect to said source and drain contacts.

20. A method of making a transistor with a self-aligned stem of a T-shaped gate, the method including the steps of:
  i. forming a plurality of layers over a substrate, at least one of said plurality of layers being a layer which will become a channel of said transistor;
  ii. forming a sacrificial gate above said layer which will become said channel, the sacrificial gate having a given width;
  iii. forming at least one sacrificial sidewall disposed on at least one side of said sacrificial gate, the at least one sacrificial sidewall having at least one width which when added to the given width of the sacrificial gate will define a spacing between yet to be formed source and drain contacts;
  iv. using the sacrificial gate and said at least one sacrificial sidewall disposed on at least one side of said sacrificial gate as an etch mask and etching unmasked portions of at least some of said plurality of layers whereby the etching results in a partial etching of the layer which will become said channel;
  v. forming said source and drain contacts on the partial etching of the layer which will become said channel and immediately adjacent the sacrificial gate and/or adjacent said at least one sacrificial sidewall disposed on at least one side of said sacrificial gate;
  vi. forming a mask over said source and drain regions;
  vii. removing the sacrificial gate to thereby define an opening in said mask;
  viii. forming a metallic structure in said opening, the metallic structure forming said stem, the stem being locationally defined with respect to the drain and source contacts by the widths of said at least one sacrificial sidewall; and
  ix. forming a gate head on said stem.

21. The method of making a transistor with a self-aligned stem of a T-shaped gate of claim 10 further including forming at least one additional sidewall spacer on at least one side of said opening.

22. A method of making a transistor, the method including the steps of:
  i. forming a plurality of layers over a substrate, at least one of said plurality of layers being a layer which will become a channel of said transistor;
  ii. forming a sacrificial gate above said layer which will become said channel, the sacrificial gate having a given width;
  iii. using the sacrificial gate as an etch mask and etching unmasked portions of at least some of said plurality of layers whereby the etching results in a partial etching of the layer which will become said channel;
  iv. forming said source and drain contacts directly on the partial etching of the layer which will become said channel;
  v. forming a mask over said source and drain contacts;
  vi. removing the sacrificial gate to define thereby an opening in said mask;
  vii. forming a metallic structure in said opening, said metallic structure forming at least a portion of a gate of said transistor; and
  viii. forming metallic contacts on said source and drain contacts and covering any exposed portions of said source and drain contact with a dielectric material.

23. The method of claim 22 wherein said source and drain contacts are formed from a n type semiconductor material, said n type semiconductor material having a doping level greater than $5\times10^{19}$ cm$^{-3}$.

24. A method of making a device having a T-shaped gate, the T-shaped gate having a stem portion having vertical sidewalls, the method comprising locating the vertical sidewalls of the stem portion relative to drain and source contacts of the device by forming a plurality of sidewall spacers also having vertical sidewalls, with a greater number of sidewall spacers being formed on one side of the stem portion than are formed on an opposing side of the stem portion, each of the plurality of sidewall spacers intersecting an imaginary line which also intersects the drain and source contacts of the device, the vertical sidewalls of two of the spacers forming an opening with vertical sidewalls, and depositing metal in the opening with vertical sidewalls, the metal deposited in the opening with vertical sidewalls forming the stem of the T-shaped gate.

25. The method of claim 24 wherein sidewall spacers disposed closest to the stem of the gate have a common width.

26. The method of claim 24 wherein the greater number of the sidewall spacers used on the drain side of the stem of the gate are all positioned laterally between the drain contact and the stem of the gate in a side by side orientation.

27. The method of claim 24 wherein the greater number of the sidewall spacers used on the drain side of the stem of the gate each have a major axis which essentially parallels a major axis of the stem of the gate.

28. The method of claim 24 wherein each of the sidewall spacers has a direction of elongation which parallels a direction of elongation of a major axis of the stem portion.

* * * * *